United States Patent
Eakins et al.

(10) Patent No.: US 8,185,360 B2
(45) Date of Patent: *May 22, 2012

(54) METHOD AND APPARATUS FOR OBTAINING A POLAR PROJECTION FOR A FLIGHT DECK WINDOW OR THE LIKE

(75) Inventors: Mark E. Eakins, Kirkland, WA (US); Steven B. Rogers, Seattle, WA (US)

(73) Assignee: The Boeing Company, Chicago, IL (US)

( * ) Notice: Subject to any disclaimer, the term of this patent is extended or adjusted under 35 U.S.C. 154(b) by 764 days.

This patent is subject to a terminal disclaimer.

(21) Appl. No.: 11/549,635

(22) Filed: Oct. 13, 2006

(65) Prior Publication Data

US 2008/0154550 A1   Jun. 26, 2008

(51) Int. Cl.
*G06F 17/50* (2006.01)
*G09B 19/16* (2006.01)
*G09B 9/08* (2006.01)

(52) U.S. Cl. .................... 703/1; 434/38; 434/41
(58) Field of Classification Search ........ 703/1; 434/38, 434/41
See application file for complete search history.

(56) References Cited

U.S. PATENT DOCUMENTS

| | | | | |
|---|---|---|---|---|
| 6,636,370 B2* | 10/2003 | Freeman | | 359/894 |
| 6,881,472 B2* | 4/2005 | Freeman | | 428/172 |
| 2003/0125855 A1* | 7/2003 | Breed et al. | | 701/36 |
| 2003/0169213 A1* | 9/2003 | Spero | | 345/7 |
| 2007/0156295 A1* | 7/2007 | Stephane | | 701/1 |

\* cited by examiner

*Primary Examiner* — Paul Rodriguez
*Assistant Examiner* — Andre Pierre Louis
(74) *Attorney, Agent, or Firm* — Caven & Aghevli LLC

(57) ABSTRACT

A computer aided design (CAD) system ascertains the clear view area of a transparency in light of head orientation and refractive properties of the transparency. Obstructions that limit the clear view are also taken into account. The CAD system is particularly useful in assessing the field of view provided to a pilot by aircraft windshields and the like.

10 Claims, 4 Drawing Sheets

METHOD AND APPARATUS FOR OBTAINING A POLAR PROJECTION FOR A FLIGHT DECK WINDOW OR THE LIKE

CROSS REFERENCE TO RELATED APPLICATION

This application is related to United States Patent Application of Steven B. Rogers and Mark E. Eakins, entitled "Method and Apparatus for Transferring an Angle-Angle Vision Graph to a Three Dimensional Surface," filed in the United States Patent and Trademark Office on even date herewith.

TECHNICAL FIELD

This disclosure relates to the field of computer aided design. More particularly, this disclosure relates to a computer aided design apparatus and method that ascertains the clear view area provided by a transparency such as an aircraft windshield and the like.

BACKGROUND

There is a need for a new and more intuitive method for analyzing the external field of view afforded pilots by the windows on the flight deck of an aircraft. The external field of view created by an airliner's flight deck windows must satisfy many regulatory and design requirements intended to insure that the view is adequate for the pilots to operate the aircraft safely and gives them a reasonable opportunity to see and avoid other aircraft that pose a collision threat.

The external visual field can be evaluated using "polar projections," which are angle-angle plots of the limits of the solid angle that the pilots can see out of the windows. The polar projection is a two dimensional curve that specifies combinations of left/right angles (azimuth) and up/down angles (altitude) measured from the line straight forward from the pilots' eyes. Those azimuth and altitude combinations represent the limits of the pilot's field of view out of the windows.

During the design process, proposed window designs can be evaluated by comparing the polar projection of the proposal against the polar projection of previous designs and against the regulatory requirements, expressed in angle/angle coordinates.

Polar projections for proposed window designs may be obtained by constructing sight rays from certain design eye positions or eye reference points in the cockpit to the edges of the windows. Calculating and plotting the polar projection for a window design in this manner is not a straight-forward geometric construction, however, due to the following factors. Both left and right eyes of the pilot are involved. The final graph is a union of the vision from both eyes. The pilots head is rotated as the window area is scanned; therefore the origin point for each sight ray is continuously changing. Also, the sight rays are refracted as they pass through the transparency material.

A polar projection is created by scanning visual edges that create the limits of the view out of the windows. These edges could be the edges of the window frame or the linings and the equipment inside the flight deck. The complete graph is created by scanning all the relevant edges and projecting them on a 2D angle-angle graph using the concepts noted above. This may be done for the left and right eye and the projected areas are combined to create an "ambinocular vision polar."

Previously, aircraft manufacturers used internally developed software programs to calculate and draw vision polars. This software ran on obsolete operating systems using an obsolete database program, and the software itself was poorly documented and difficult to validate. The input data consisted of coordinates for points along window edges and liners, and the output was a polar projection that could be printed or pasted into a word processor, but could not be used in a CAD program.

The old software was not interactive, not resident in a CAD program, and not available to a designer actually designing window opening shapes; therefore, it was not useful as a design tool.

SUMMARY

The problems associated with the prior techniques of generating vision polars are solved by new computer aided design (CAD) system. The results are available immediately and the vision polar curves are resident in the same CAD system. Results can be analyzed and verified using the graphics tools available in the CAD system. In one example of the invention, interactive software creates vision polars (angle-angle graphs) from 3D CAD window and equipment geometry (curves and surfaces) taking into account pilot head rotation and window refraction. In an illustrative embodiment, the computer aided design system comprises a software "script" that operates in an existing CAD program. The results are immediately available, visually intuitive, and easily usable.

DETAILED DESCRIPTION

Figure 1:
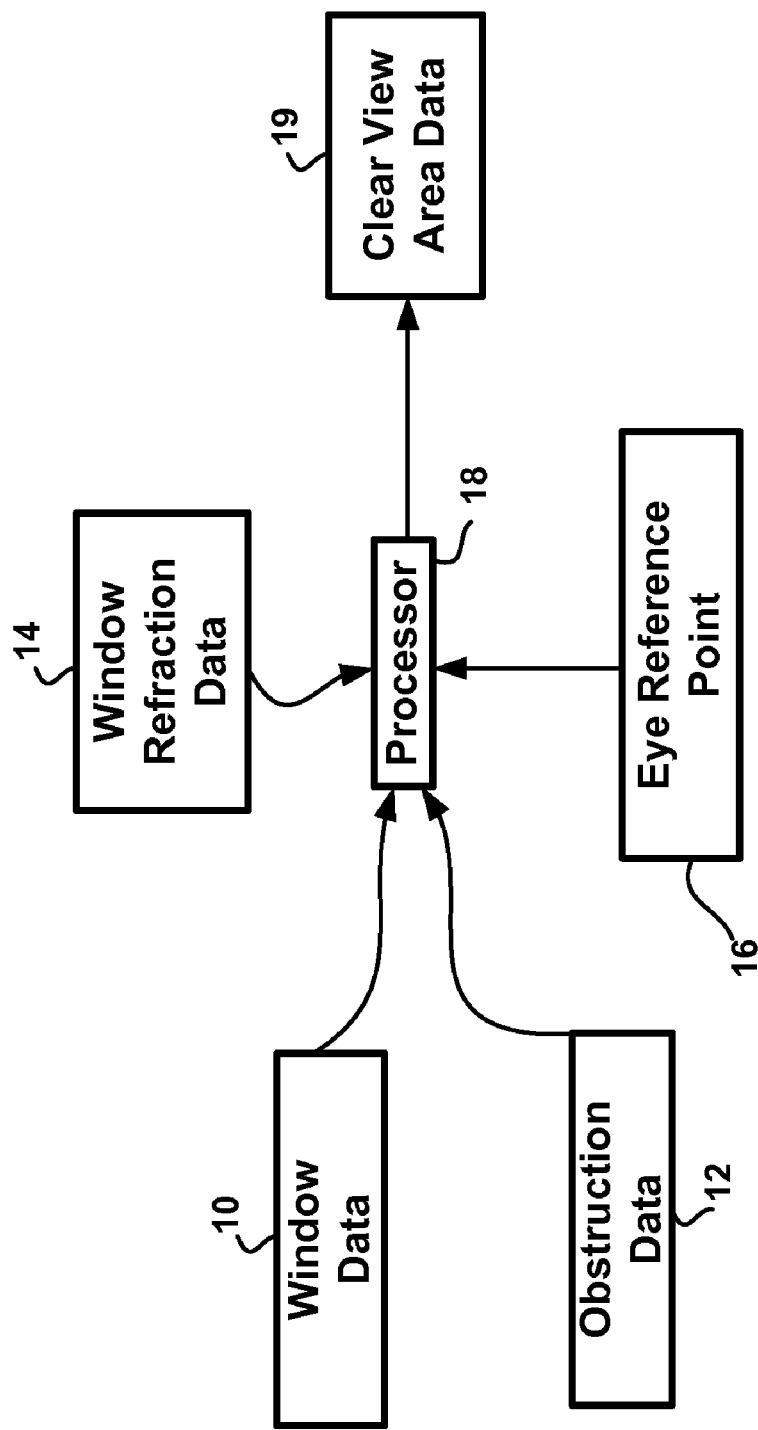
FIG. 1 is a block diagram of a computer aided design system in accordance with one embodiment of the invention that accurately determines the clear view area of an aircraft windshield.

A CAD system in accordance with this invention aids in the design and certification of aircraft flight deck windows by creating "polar projections" (angle-angle graphs) of the view out of the windows. In one embodiment, the invention may be a software script that interfaces with a host CAD program. Illustratively, the host CAD program may be the RHINO desktop based graphics program running on a personal computer (PC), available from Robert McNeel & Associates, modified through user defined scripts.

The user selects an eye reference point that locates the pilot's head, three dimensional (3D) surfaces upon which lie the inner and outer surfaces of the window, and one or more 3D curves on the inner window surface that represent obstructions to view such as window edges, lining edges, equipment in the cockpit, etc. A series of sample points is created along the selected object curves, the number of which is selected by the user.

The software creates a head pivot point and eye points with respect to the eye reference point using anthropometric dimensions such as, for example, those published in FAA Advisory Circular AC 25.773-1. For each of the sample points on the selected object curves, the software rotates the eye points about the pivot point until the pivot point, the eye reference point, and the point on the object curve are all in one vertical plane. A "sight ray" is created (by an iterative process) that extends from one of the eyes, through the target point, to the window surface, and through the window according to the laws of refraction. The azimuth and altitude angle of the ray leaving the window is plotted. The user can select whether to create a polar for one or the other or both of the eyes and many other variables that allow the software to be applied to a variety of design situations (eg. the user can select the index of refraction of the transparency material).

This software is being used in the design and certification of the Boeing 787 and future Boeing products. Elements of this software could be used for many different tasks where a view through a transparency needs to be quantified. Because of the rules for rotating the head, in its current form it suited particularly to aircraft window design. Software similar to this invention is required to design and certify any commercial aircraft. The advantage of this particular software is the ease and speed of use and its accessibility to designers.

Due to the engineering effort required to design aircraft windows and integrate them into the structure (impacting structural load paths, cutout placements for wiper motors, bulkhead locations, and the internal geometry of the flight deck), the tooling required to manufacture the windows, and the lead time thus required for finalization of the design, the importance of the capability of quickly and accurately designing window shapes that meet a set of predetermined visual requirements, provided by this invention, is difficult to overstate. If the window frames had to be redesigned after the start of window production and delivery of the first articles to the aircraft manufacturer for acceptance testing, the cost and schedule impact of the configuration changes cascading into other affected design areas would be extreme, if not catastrophic.

FIG. 1 is a block diagram of the main components of a computer aided design (CAD) system in accordance with one embodiment of this invention. The apparatus of FIG. 1 comprises a computer file, data base, or other electronic storage element 10 which contains 3D data entered by a user representing the shape, location, and orientation of an aircraft window or set of windows to be analyzed. This storage element also contains data describing the outer and inner surfaces of the windows, and may contain data describing the surface of the aircraft surrounding the windows. In addition to the window data in block 10, the apparatus of FIG. 1 may also include a computer file, data base, or other electronic storage element 12 that contains 3D input data representing the shape, location, and orientation of any obstructions to the pilot's view located in the aircraft cockpit. Those obstructions might include glareshields, the posts and linings between the windows of a multiple window aircraft windshield, and other equipment such as standby compasses and structures associated with windshield wipers.

The apparatus of FIG. 1 also comprises a storage element 14 into which the user can enter window refraction data such as the thickness of the windshield and the refractive indices of air and the material making up the windshield. Storage element 16 contains the coordinates of an eye reference point or design eye position 22 defined and entered into the system by a user. A processor 18 computes, from the value of the eye reference point 22 in block 16, a pilot head orientation comprising a plurality of eye positions corresponding to a plurality of head rotation angles. The processor 18 computes a set of data points indicating the clear view area of the window and cockpit obstructions represented by the data in blocks 10 and 12. This computation is made in light of the refraction data from block 14, and the pilot head orientation derived by the processor from the eye reference point 22 stored in block 16. The clear view area data generated by the processor 18 is stored in block 19 and may be displayed on a computer monitor by itself or superimposed on other data such as a clear view area requirement specified by regulatory authorities such as the FAA.

Figure 2:
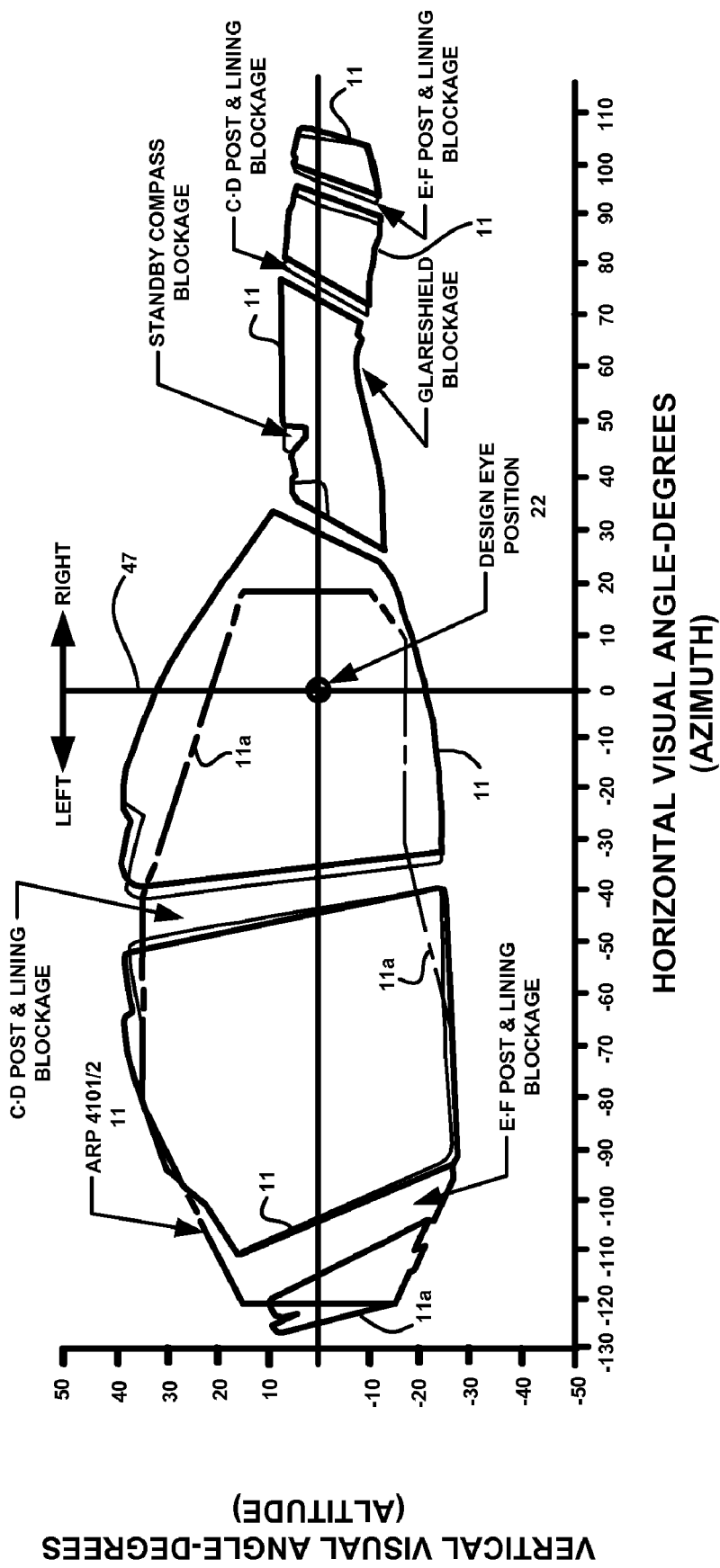
FIG. 2 is a graph depicting illustrative output data produced by the apparatus of FIG. 1.

An example of clear view area data similar to the FIG. 1 CAD system's output is shown in FIG. 2 which shows a curve 11 that represents the clear view area afforded by a typical windshield in a modern commercial aircraft. The data shown in FIG. 2 includes not only an indication of the field of view afforded the pilot by the transparencies comprising the aircraft windshield, but also an indication of the presence of obstructions to the pilot's field of view, such as post and lining blockages and blockages caused by a glareshield and a standby compass.

Superimposed on the curve 11 is another curve 11a that represents an example of a clear view area specification. Such clear view area specifications can be found in many sources, such as aviation industry research materials, military specifications, and regulatory material published by the FAA. Curve 11a may be found in FAA advisory circular AC 25.773-1. Curves like curve 11a define the minimum envelope of altitude and azimuth angles that the pilot must be able to view when looking out of an aircraft windshield.

The altitude and azimuth angles in FIG. 2 are measured with respect to a design eye position 22 which is midway between the eyes of a pilot properly seated at his station in the cockpit and looking straight ahead through the aircraft windshield. The pilot's eyes are assumed to be located a predetermined distance, such as 1.25 inches, left and right on either side of the design eye position 22. The pilot's head is assumed to rotate about a vertically directed central axis 47 located a predetermined distance behind the design eye position 22, such as 3 5/16 inches aft of the design eye position 22. These dimensions for the eye positions and axis of head rotation are based on anthropometric data regarding human cranial dimensions. The invention is not limited to any particular assumptions about the eye location or head rotation axis, however.

The azimuth angles are measured from a vertical datum plane running fore and aft of the aircraft through the design eye point 22 and parallel to the central longitudinal axis of the aircraft. The altitude angles are measured from a horizontal datum plane perpendicular to the vertical plane that also passes through the design eye point 22.

The curve 11 may be compared to the curve 11a to determine whether the windshield meets the clear view area specification. Although this embodiment of the invention is described here in terms of clear view area specifications defined by the FAA, the invention is not limited to any particular form of clear view area specification.

Figure 3:
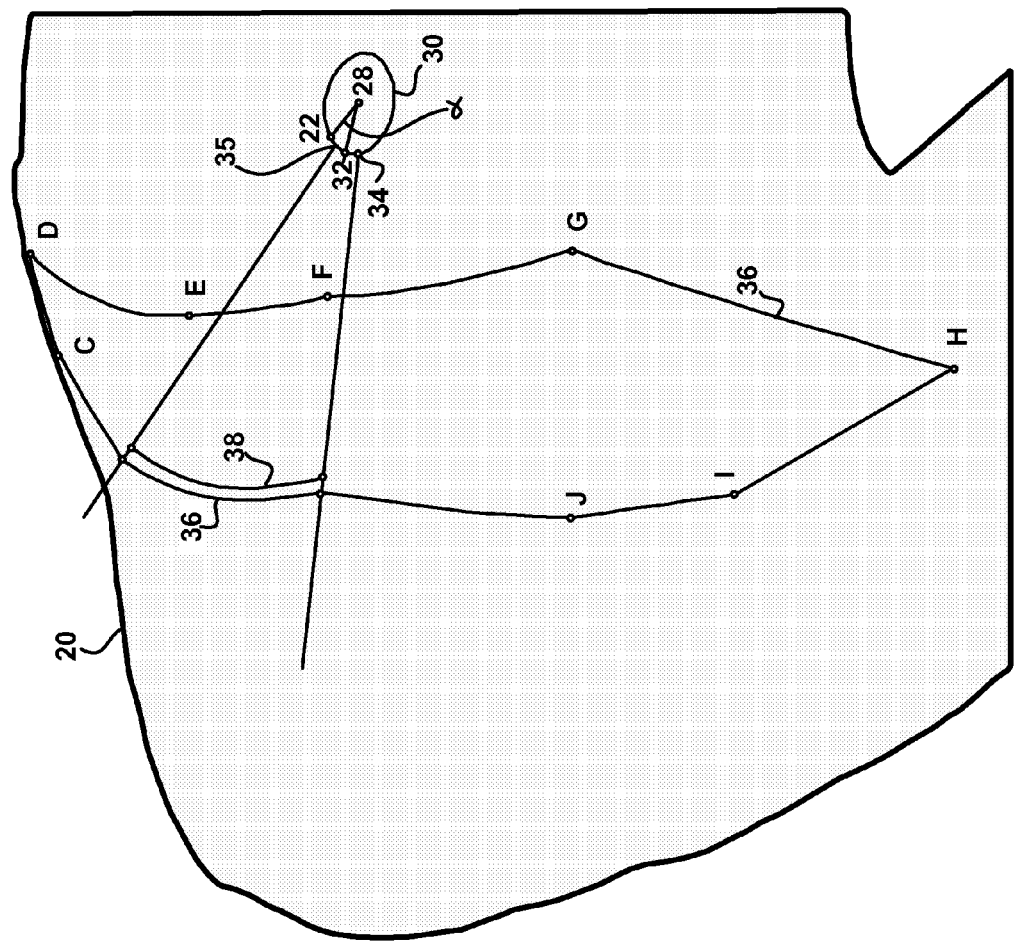
FIG. 3 is a diagram illustrating a determination of the clear view area of an aircraft window in accordance with one embodiment of the invention.
Figure 3:
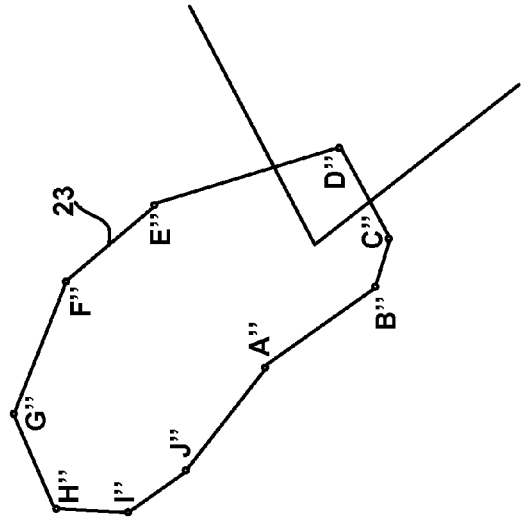
Figure 4:
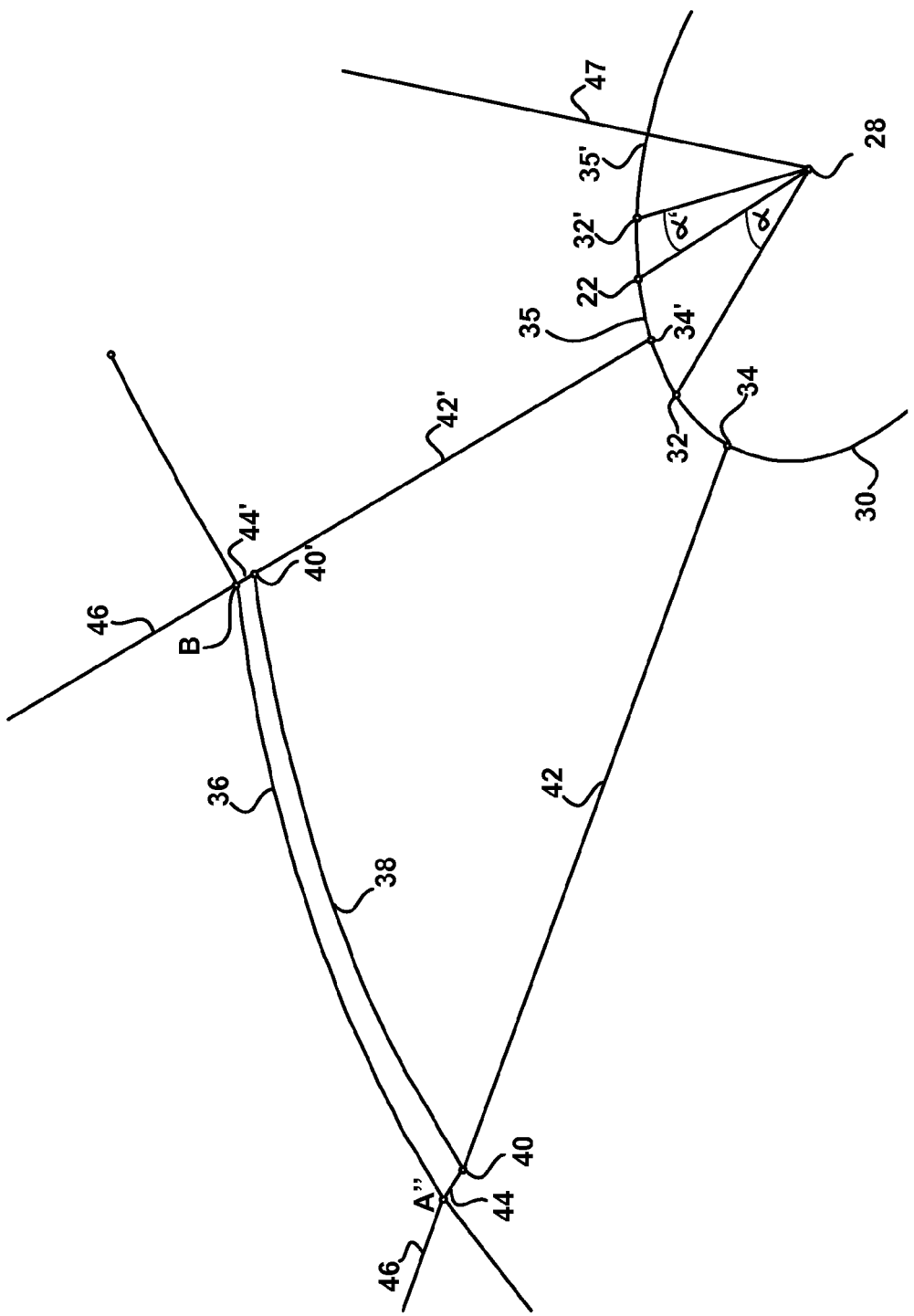
FIG. 4 is a magnified view of a portion of the diagram of FIG. 3.

FIGS. 3 and 4 are a graphical representation of the operation of the CAD system shown in FIG. 1. The technique implemented by the apparatus of FIG. 1, and shown graphically in FIGS. 3 and 4, takes into account head rotation, left and right eye positions, and window refraction in computing the clear view area of the windshield. This results in a more accurate assessment of how much a pilot can see out of the windshield. Both left and right eye plots can be produced by using the apparatus of FIG. 1. Plots based on the eye reference point 22, or any other point, also may be produced. FIGS. 3 and 4 depict a left eye plot produced by the apparatus of FIG. 1.

FIG. 3 graphically depicts the eye reference point 22, a head pivot point 28 on the previously mentioned central axis of head rotation 47, and a circle 30 around which the eye reference point 22 rotates as the pilot's head rotates. FIG. 3 also shows a point 32 which is the location of the eye reference point after an angular rotation a of the head to the left. FIG. 3 shows another point 34 which is the location of the left eye after a head rotation through the angle α. Point 35 is the location of the right eye after a head rotation through angle α. Curve 38 is data that represents either a segment of the edge of the inner surface of the window being evaluated (as shown) or an edge of an obstruction as viewed from the left eye and projected onto the inner surface of the window being evaluated.

The processor 18 in FIG. 1 plots the altitude and azimuth of sight rays emanating from curve 36 to form a curve on the azimuth-altitude plane of FIG. 2. More specifically, the processor 18 computes a left eye curve 23 in FIG. 3 representing the clear view area of the windshield with the obstructions. Similarly, the processor 18 may compute a corresponding curve for the right eye. The processor 18 may also compute a curve for the eye reference point 32 (with or without any head rotation) or for any other desired point.

In this example of the invention, the processor 18 constructs refracted rays originating at the left eye position 34 or the right eye position 35 at a plurality of different angular head positions, or from the original eye reference point 22. The invention can also be adapted to construct refracted rays emanating from other points, for example, from the eye reference point as it sweeps through a plurality of head positions. The rays extend to points on a curve on the inner windshield surface, undergo a simulated refraction as they pass through the space between the inner window surface and the outer surface of the window, and then undergo an additional simulated refraction as they emerge from the outer surface of the window. The processor 18 engages in an iterative procedure to find the rays beginning at different eye positions that emerge from the window's outer surface. At each of the points on the outer surface from which these rays emerge, the processor 18 measures and records the azimuth and altitude of the emergent ray which thus becomes a data point on the azimuth-altitude plane of FIG. 2. Joining the measured azimuth-altitude points results in curve 23 shown in FIG. 3.

The processor 18 first creates a series of sample points on curve 38, the number of which is equal to the value selected by the user. The processor 18 then calculates a set of altitude and azimuth values corresponding to each sample point as follows. The processor 18 sets the head rotation angle so that the eye reference point 32 and the first sample point are in the same vertical plane, and computes one or both of the left eye position 34 and the right eye position 35. If a left eye plot is to be generated as in FIG. 3, the processor 18 then constructs a refracted sight ray that extends from the left eye position 34 through the simulated windshield. The sight ray is composed of a first incident line segment directed toward the sample point as a first approximation. One end point of that first line segment is the computed left eye position 34 and the other end point is the sample point on curve 38 on the inside surface of the window. Using the laws of refraction, a second line segment is constructed representing the simulated path of the sight ray through the simulated windshield from the point of intersection between the first line segment and the inside surface of the windshield to the point where the ray exits windshield. The processor 18 then constructs an exit portion of the refracted sight ray emerging from the windshield, using the laws of refraction, and compares the location of the exit point with the location of the curve representing the periphery of the clear area of the windshield. If the refracted sight ray emerges from the within the clear area of the window, the azimuth and altitude of the exit portion of the sight ray is saved by the processor 18 in a data array to be plotted as a point on the azimuth-altitude plane. If the refracted sight ray emerges from the aircraft surface outside of the clear area of the windshield, the head rotation angle, altitude angle, and/or azimuth angle of the incident line segment of the refracted ray at the left eye point 34 is adjusted a small amount and the ray recomputed. This process of is continued iteratively until the exit portion of the refracted ray emerges from the within the clear area of window and within a user specified tolerance relative to the clear area periphery. Then, the azimuth and altitude angles of the exit portion of the sight ray are saved by the processor 18 in a data array to be plotted as a point on the azimuth-altitude plane. This process is repeated for all of the sample points created on the selected curve segment such as curve 38, and the altitude-azimuth points are then plotted and connected together to create curve segment A"-B" on curve 23. This process can be continued for all curves such as curve 38, which together comprise the peripheral sight limits on the inside surface of a window, to create curve segments such as B"-C" through J"-A", which, when connected together to form left eye curve 23, defines the clear view area of the windshield and its associated obstructions in the cockpit of the airplane. A right eye curve may be computed in the same manner using computed right eye point 35 positions as the initial points for incident rays, or a plot can be made using the eye reference point 32, with or without head rotation.

A detailed description of the construction of one of the projected curve segments that comprise curve 23 will now be described with reference to FIG. 4, a close up view of the construction from behind and above the design eye position 22. Construction of any other projected curve segment is similar. Consider, for example, the projected curve segment A"-B" on curve 23 that corresponds to the curve between points 40 and 40' on 3D curve 38. To begin the construction, the user selects the eye reference point and 3D geometry representing the outer aircraft surface on which the outer surface of the window lies, the inner surface of the window, the outer surface of the window (the limit of the clear view), and a closed curve that forms the boundary of the outer surface of the window. These elements are loaded into storage elements 10 and 16 in FIG. 1. The user then enters window refraction data, iteration tolerance data, and the desired number of sample points to be used by the processor 18. The user then selects 3D curve segments such as 40-40' that represent either the inner edges of the window or the projection of interior blockages on the inner window surface (accomplished by another CAD process). Considering curve segment 40-40', the processor creates an equally spaced series of sample points along the curve corresponding to the number entered by the user. The first such point will be point 40. The processor 18 then reads the positional coordinates of point 40. The processor 18 then rotates the simulated pilot's head about a vertical axis 47 by an angle α so that point 40, the eye reference point 32, and the axis 47 are in the same plane. The processor 18 then computes the left eye position 34. The processor 18 then constructs an incident line segment 42 extending from left eye position 34 to point 40. The processor 18 next constructs an interior line segment 44 which extends from point 40 through the simulated windshield in a direction dictated by the laws of refraction. The direction of segment 44 is a function of the angle of incidence of segment 42 on the inside surface of the windshield, the refractive index of air, and the refractive index of the windshield material. The sight ray constructed by the processor 18 also undergoes refraction when it emerges from the surface upon which the outer surface of the simulated windshield lies. The processor 18 constructs an exit portion 46 of the refracted ray from the exit point A in a direction dictated by the laws of refraction. The processor 18 determines whether the exit point A is on the outer window surface or on the aircraft surface outside the window area. If point A is on the outer window surface, the azimuth and altitude angles of the exit portion 46 of the sight ray are recorded and stored in an array. If the exit portion 46 does not emerge from the outer surface of the windshield, the processor 18 iteratively adjusts the direction of the segment 42 until point A on an exit portion 46 is on the outer window surface and within the user defined tolerance distance to the curve defined by the boundary of the window surface. The altitude and azimuth of the exit portion 46 emerging from point A is then recorded and saved in an array. This process is repeated to find sight rays and exit points for each of the sample points along curve 38 until finally the altitude and azimuth of exit portion 46' at point B is obtained using rotation $\alpha'$, points 34,' 40', lines 42', 44' and any required iteration. The projected line segment on the curve 23 between points A" and B" is then constructed as a smooth curve passing through all of the calculated azimuth-altitude coordinate points stored in the array. This process can be repeated for each of the curve segments that define the limit of the view to the inside of the window surface such as curve 38 to obtain the curve segments on the curve 23 between points B"-J."

As noted above, this invention creates a more accurate determination of the clear view area of a given window and cockpit design for an aircraft. The curve 23 in FIG. 3 is a left eye plot. As indicated above, a right eye plot can also be obtained. An eye reference point plot is also possible. Because of the displacements between the left eye, the right eye, and the eye reference point, curves 23 for the left eye, the right eye, and the eye reference point will differ slightly.

The Title, Technical Field, Background, Summary, Brief Description of the Drawings, Detailed Description, and Abstract are meant to illustrate the preferred embodiments of the invention and are not in any way intended to limit the scope of the invention. The scope of the invention is solely defined and limited in the claims set forth below. For example, the invention is not limited to applications involving aircraft windows. It is applicable to any situation involving a determination of how much can be seen through a transparency.

The invention claimed is:

1. A computer aided design system for determining the clear view area of a transparency, comprising:
   a source of data representing the shape and location of the transparency;
   a source of data representing head orientation; and
   a processor that generates output data representing the clear view area of the transparency in response to the data representing the shape and location of the transparency and the data representing head orientation;
   wherein the output data representing the clear view area of the transparency is a two dimensional angle vision graph representing left and right viewing angles and up and down viewing angles for both a left eye position and a right eye position with respect to the eye reference point, and wherein the processor:
      rotates the left eye position and the right eye position about a pivot point until the pivot point, the left eye position, and the right eye position, the reference point, and a point on an object curve all lie in a single vertical plane; and
      creates a sight ray that extends from at least one of the left eye position or the right eye position through a target point and through the transparency.

2. The computer aided design system of claim 1, in which the data representing head orientation comprises the location of an eye reference point selected by a user during a design process.

3. The computer aided design system of claim 1, in which the processor computes the location of an axis of head rotation with respect to the eye reference point and a set of data points defining a clear view area curve.

4. The computer aided design system of claim 3, in which the processor superimposes the clear view area curve over a clear view area specification curve on a display module.

5. A computer aided design system for determining the clear view area of a transparency, comprising:
   a source of data representing the shape and location of the transparency;
   a source of data representing one or more refractive properties of the transparency; and
   a processor that generates output data representing the clear view area of the transparency in response to data representing the shape and location of a transparency and the data representing one or more refractive properties of the transparency;
   wherein the data representing the clear view area of the transparency is a two dimensional angle vision graph representing left and right viewing angles and up and down viewing angles for both a left eye position and a right eye position with respect to the eye reference point, and wherein the processor:
      rotates the left eye position and the right eye position about a pivot point until the pivot point, the left eye position, and the right eye position, the reference point, and a point on an object curve all lie in a single vertical plane; and
      creates a sight ray that extends from at least one of the left eye position or the right eye position through a target point and through the transparency;
      generates a clear view curve representing the clear view area of the transparency further in response to the data representing head orientation; and
      superimposes the clear view area curve over a clear view area specification curve on a display module.

6. The computer aided design system of claim 5, in which the refractive properties of the transparency comprises the index of refraction and thickness of the transparency.

7. The computer aided design system of claim 5, in which the processor generates the clear view area further in response to data representing obstructions present in the cockpit of the aircraft.

8. A method of ascertaining the clear view area of an aircraft windshield using a computer aided design system, comprising the steps of:
   inputting data representing the shape and location of the windshield;
   inputting data representing an eye reference point;
   generating data representing pilot eye position and pilot head rotation in response to the data representing the eye reference point;
   inputting data representing refractive properties of the windshield; and
   generating output data representing the clear view area of the windshield in response to the data representing the shape and location of the windshield, the data representing the pilot eye position and head rotation, and the data representing the refractive properties of the windshield;

wherein said generated output data representing the clear view area is a two dimensional angle vision graph representing left and right viewing angles and up and down viewing angles for both a left eye position and a right eye position with respect to the eye reference point;

rotating the left eye position and the right eye position about a pivot point until the pivot point, the left eye position, and the right eye position, the reference point, and a point on an object curve all lie in a single vertical plane; and creating a sight ray that extends from at least one of the left eye position or the right eye position through a target point and through the transparency.

9. The method of claim 8, further comprising the step of:
inputting data representing one or more obstructions in the cockpit of the aircraft; and
generating output data representing the clear view area of the window further in response to the data representing one or more obstructions in the cockpit of the aircraft.

10. The method of claim 8, further comprising:
generating a clear view curve representing the clear view area of the transparency further in response to the data representing head orientation; and
superimposing the clear view area curve over a clear view area specification curve on a display module.

* * * * *